United States Patent [19]

Goodman

[11] 4,007,477

[45] Feb. 8, 1977

[54] ASSEMBLY OF A RECESSED HEAT SINK AND A SEMICONDUCTOR DEVICE SEALED WITHIN THE RECESS IN THE HEAT SINK AND THERMALLY CONNECTED TO THE HEAT SINK

[75] Inventor: Dennis George Goodman, Birmingham, England

[73] Assignee: The Lucas Electrical Company Limited, Birmingham, England

[22] Filed: Dec. 30, 1974

[21] Appl. No.: 537,337

[30] Foreign Application Priority Data

Jan. 18, 1974  United Kingdom ............... 2391/74

[52] U.S. Cl. .................................. 357/81; 357/72; 357/74; 357/79
[51] Int. Cl.² .................. H01L 23/28; H01L 23/02; H01L 23/12; H01L 23/42
[58] Field of Search .................. 357/72, 74, 79, 80, 357/81

[56] References Cited

UNITED STATES PATENTS

| | | | |
|---|---|---|---|
| 3,176,382 | 4/1965 | Dickson et al. | 357/81 |
| 3,449,506 | 6/1969 | Weinstein et al. | 357/81 |
| 3,474,302 | 10/1969 | Blundell | 357/81 |
| 3,513,360 | 5/1970 | Andersson et al. | 357/79 |
| 3,743,896 | 7/1973 | Weiske et al. | 357/81 |

FOREIGN PATENTS OR APPLICATIONS 1,459,516  10/1966  France ................................ 357/81

Primary Examiner—Andrew J. James

[57] ABSTRACT

A semi-conductor assembly includes a conductive stud and a semi-conductor device mounted on the stud so that a first contact area of the device is thermally and electrically connected thereto. Thermally and electrically connected to a second contact area of the device is an expanded head portion of an electrical lead. A body is shaped to define a recess in which the stud is engaged so that the device is accommodated in the space defined between the stud and the walls of the recess, the electrical lead extending through an aperture in one of said walls. Sealing means prevents ingress of foreign material through the aperture into said space, and a resilient member is trapped and deformed between the head portion of the lead and the body so that the head portion of the lead is urged into pressure contact with the device.

3 Claims, 1 Drawing Figure

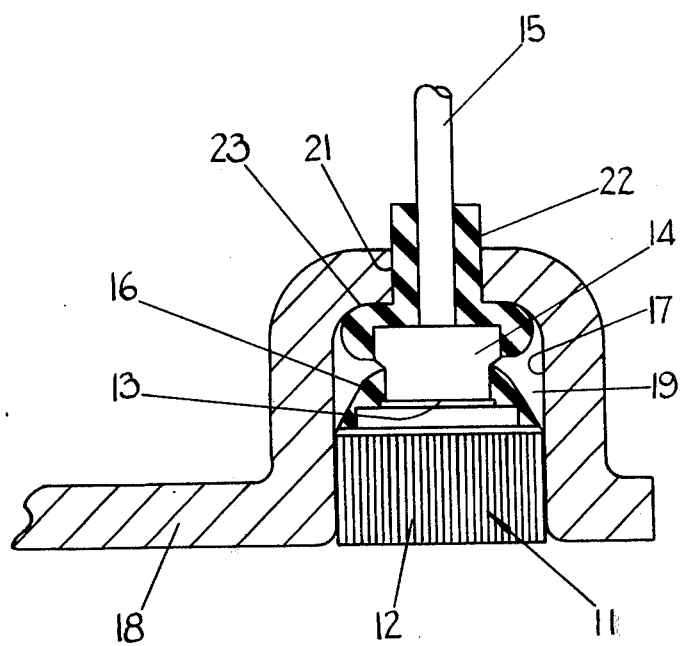

ASSEMBLY OF A RECESSED HEAT SINK AND A SEMICONDUCTOR DEVICE SEALED WITHIN THE RECESS IN THE HEAT SINK AND THERMALLY CONNECTED TO THE HEAT SINK

This invention relates to semi-conductor assemblies.

An assembly, according to the invention, includes a conductive stud, a semi-conductor device mounted on said stud so that a first contact area of the device is thermally and electrically connected thereto, an electrical lead including an expanded head portion which is thermally and electrically connected to a second contact area of the device, a body shaped to define a recess in which said stud is engaged so that the device is accommodated in the space defined between the stud and the walls of the recess, the electrical lead extending through an aperture in one of said walls, sealing means for preventing ingress of foreign material through said aperture into said space, and a resilient member trapped and deformed between the head portion of the lead and said body so that the head portion is urged into pressure contact with the device.

Preferably, said sealing means includes a resilient sleeve engaged in said aperture with said lead extending through the bore in the sleeve.

Conveniently, said resilient member is in the form of annular flange integral with said sleeve.

Preferably, the stud is engaged as a press fit in the recess and is knurled at its periphery so that material of the heat sink is displaced during engagement of the stud in the recess.

The accompanying drawing is a sectional view of part of a semi-conductor assembly according to one example of the invention.

Referring to the drawing, the assembly includes a substantially cylindrical copper stud 11, the periphery of which is knurled at 12. Soldered to one axial end surface of the stud 11 is a semi-conductor device 13 which in this particular example is a diode having its contact areas defined on opposite major surfaces respectively of the device. The arrangement is such that one contact area of the device 13 is thermally and electrically connected to an expanded head portion 14 of an electrical lead 15. Moreover, a layer 16 of silicone rubber extends between said one axial end surface of the stud 11 and the head portion 14 and over the exposed edge of the device 13 to provide protection for the device 13.

The stud 11 is engaged as a press fit in a substantially cup-shaped recess 17 defined by an aluminium heat sink 18 so that the device 13 is thermally connected to the heat sink 18 by way of the stud 11. The arrangement is such that the device 13 and head portion 14 are accommodated within the space 19 defined between the base of the recess 17 and the stud 11 whereby the heat sink 18 defines the housing of the assembly, the lead 15 extending from the housing by way of an aperture 21 in the base of the recess 17. Engaged in the aperture 21 is a resilient sleeve 22 which is conveniently formed from silicone rubber and which is carried by the lead 15. The sleeve 22 is provided with an integral annular flange 23 which extends around the lead 15 as it projects into the aperture 21 so as to seal the aperture against ingress of foreign material.

In producing the assembly described above, the required interconnections between the stud 11, the device 13 and the lead 15 are first completed and the lead 15 is then pushed through the bore in the sleeve 22. The resultant subassembly is then inserted into the recess 17, the relative dimensions of the recess 17 and the stud 11 being such that material of the heat sink 18 is removed as the stud moves into the recess. Thus, in the completed assembly the stud 11 is firmly held by the heat sink 18. In addition the dimensions of the sleeve 22 are such that during engagement of the stud 11 with the heat sink 18, the flange 23 is trapped and deformed against the head portion 14 and the base of the recess 17 so as to improve sealing of the aperture 21 and also urge the head portion 14 into pressure contact with the device 13 and the device 13 into pressure contact with the stud 11. It is found that the pressure contact afforded by deformation of the sleeve 23 reduces the tendency for the lead 15 to become disconnected from the device 13 when the assembly is in use under conditions where considerable vibration is experienced, for example in a road vehicle. Of course, the sleeve 23 also serves to insulate the lead 15 from the heat sink 18.

I claim:

1. A semi-conductor assembly including a conductive stud, a semi-conductor device, a first contact area of said device being thermally and electrically connected to said stud, and electrical lead including an expanded head portion, said head portion being thermally and electrically connected to a second contact area of said device, a single body of thermally conductive material forming a heat sink and provided with a cup-shaped recess portion having a bottom wall portion and an aperture through said bottom wall portion, said recessed portion receiving said conductive stud in thermal engagement therewith to close the open end of said recess, said electrical lead passing through said aperture in said recess, sealing sleeve means of insulating material passing through said aperture and disposed between said electrical lead and said aperture to prevent ingress of foreign material into said recess through said aperture, and deformable resilient means disposed within said recess between the expanded head portion of said electrical lead and the inner wall of said recess to urge the head portion of said lead into pressure contact with the second contact area of said semi-conductor device.

2. A semi-conductor assembly as claimed in claim 1 wherein said sleeve means is provided with an annular flange at the inner end therefor for engagement with the inner surface of said recess annularly about said aperture.

3. A semi-conductor assembly as claimed in claim 1 wherein said conductive stud is knurled about its periphery for pressing engagement into said recess whereby the material of said conductive body is displaced when said stud is pressed thereinto.

* * * * *